US008169791B2

(12) United States Patent
Wolf et al.

(10) Patent No.: US 8,169,791 B2
(45) Date of Patent: May 1, 2012

(54) ELECTRONIC MODULE AND METHOD FOR PRODUCING SUCH A MODULE

(75) Inventors: Kuno Wolf, Jungingen (DE); Thomas Koester, Reutlingen (DE); Stefan Hornung, Leinfelden-Echterdingen (DE); Wolfgang Feiler, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 943 days.

(21) Appl. No.: 12/092,920

(22) PCT Filed: Nov. 9, 2006

(86) PCT No.: PCT/EP2006/068282
§ 371 (c)(1),
(2), (4) Date: May 7, 2008

(87) PCT Pub. No.: WO2007/079997
PCT Pub. Date: Jul. 19, 2007

(65) Prior Publication Data
US 2008/0247142 A1 Oct. 9, 2008

(30) Foreign Application Priority Data
Dec. 28, 2005 (DE) .......................... 10 2005 062 783

(51) Int. Cl.
*H05K 7/00* (2006.01)
*H05K 1/18* (2006.01)

(52) U.S. Cl. ........ 361/783; 361/760; 361/763; 361/764; 257/676

(58) Field of Classification Search .................. None
See application file for complete search history.

(56) References Cited

U.S. PATENT DOCUMENTS

| 5,747,875 | A | 5/1998 | Oshima | |
|---|---|---|---|---|
| 6,222,265 | B1 * | 4/2001 | Akram et al. | 257/723 |
| 6,257,215 | B1 | 7/2001 | Kaminaga et al. | |
| 6,356,453 | B1 * | 3/2002 | Juskey et al. | 361/760 |
| 6,441,484 | B2 | 8/2002 | Koyama et al. | |
| 6,812,553 | B2 * | 11/2004 | Gerbsch et al. | 257/673 |
| 6,956,743 | B2 | 10/2005 | Miller et al. | |
| 7,084,492 | B2 * | 8/2006 | Jayaraman | 257/687 |
| 7,095,619 | B2 * | 8/2006 | Panella et al. | 361/760 |
| 7,335,987 | B2 * | 2/2008 | Huang | 257/734 |
| 7,687,947 | B2 * | 3/2010 | Urbach et al. | 310/71 |
| 2004/0125580 | A1 * | 7/2004 | Chung et al. | 361/794 |
| 2005/0173786 | A1 | 8/2005 | Huang | |

(Continued)

FOREIGN PATENT DOCUMENTS
DE 198 57 959 7/2000
(Continued)

*Primary Examiner* — Boris Chervinsky
(74) *Attorney, Agent, or Firm* — Michael J. Striker

(57) ABSTRACT

Electronic module (10), and an electric motor (12) containing one, and also a production method for one, having an electrically conductive first substrate (16) which has a basic body (54) and which has a second electrically conductive substrate (18) mounted on it, and having at least one power component which is arranged on a first substrate (16), and the second substrate (18) is fitted with further components (40) on a side (32) which is remote from the first substrate (16), where the second substrate (18) has a smaller base area (19) than the basic body (54) of the first substrate (16), and the power components (22) are mounted on the first substrate (16) outside the outer perimeter (70) of the second substrate (18)—next to the latter.

10 Claims, 1 Drawing Sheet

U.S. PATENT DOCUMENTS

Figure 1:
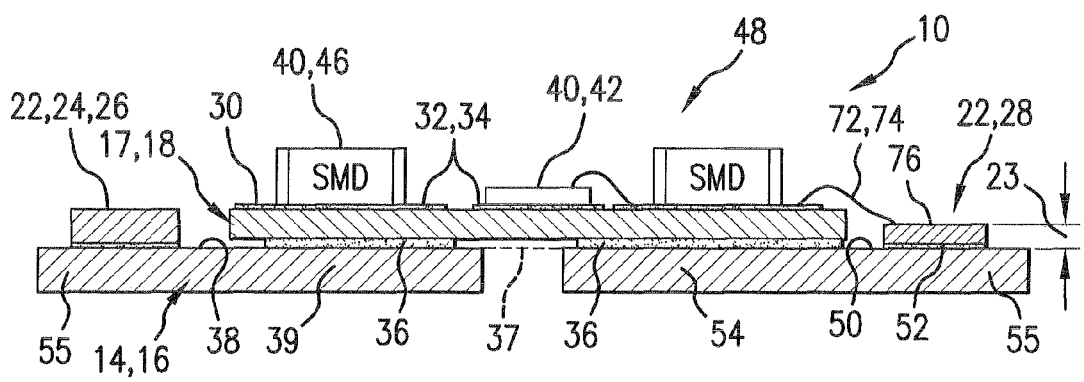

2007/0133183 A1  6/2007  Urbach et al.

FOREIGN PATENT DOCUMENTS

| | | |
|---|---|---|
| DE | 103 52 079 | 6/2005 |
| EP | 0 817 266 | 1/1998 |
| EP | 1 057 384 | 12/2000 |
| EP | 1 401 019 | 3/2004 |
| JP | 9-213877 | 8/1997 |
| JP | 2000-269415 | 9/2000 |
| JP | 2001-332687 | 11/2001 |
| JP | 2002-208675 | 7/2002 |
| JP | 2003-203805 | 7/2003 |
| JP | 2003-258181 | 9/2003 |
| WO | 2005/046020 | 5/2005 |

* cited by examiner

ELECTRONIC MODULE AND METHOD FOR PRODUCING SUCH A MODULE

The invention relates to an electronic module, to an electric motor containing such a module, and to a method for producing such an electronic module, as generically defined by the preambles to the independent claims.

PRIOR ART

In German Patent Disclosure DE 103 52 079 A1, an electric motor has been disclosed which has an electronic module that is located inside the gearbox. The electronic module is embodied here by sandwich construction, in which electronic power components are located between a stamped grid, as a first conductive substrate, and a second conductive substrate. The power components are connected via their upper and lower surfaces directly to the two conductive substrates; the first substrate is connected to the second substrate by means of soldering or a conductive adhesive. The disadvantage of this kind of sandwich construction is that if only one power component is used, or a plurality of power components that have different heights, the two substrates can be aligned parallel to one another only at very great effort and expense, and the contacting between the semiconductor components of the two substrates is not very reliable.

DISCLOSURE OF THE INVENTION

The device according to the invention and the production method according to the invention having the characteristics of the independent claims have the advantage that because of the embodiment of the second substrate with a small base, the power components can be secured to the first substrate next to the second substrate. As a result, the second substrate can be located directly on the first substrate, without there being components of different heights located between the two substrates. As a result, the total structural height of the electronic module can be reduced, and an exactly parallel alignment of the two substrates can be attained. The power components can be soldered directly to the first substrate in the horizontal direction next to the second substrate.

The power components here have no plastic housing of their own and thus can be secured to the first substrate by means of soldering or adhesive bonding. The back side of the component is joined directly to the substrate. To that end, a joining form can be used into which the first substrate is inserted along with the power components.

For instance, if what is known as the die attach method is employed to begin to solder the power components to a stamped grid strip (lead frame), a separate joining form is not needed, and the manufacturing process is thus simplified.

For the connection between the first and second substrates, an electrically insulating adhesive is advantageously used, so that it is ensured that even if there is only slight spacing between the two substrates, no undesired leakage currents will flow.

The two substrates are then connected to one another for electrical contacting purposes by means of bond wires. The power components are favorably also electrically contacted to the first and/or second substrate by means of bond wires.

As the first substrate, a metal stamped grid is preferably used that has a base body and extensions integrally formed onto it. The extensions are at least some of them embodied as securing elements, for instance with a bore by means of which the stamped grid can be fixed in a joining form in the production process.

In a preferred embodiment, the second substrate is embodied as a hybrid ceramic, which has been assembled with various electronic components before being mounted on the first substrate. The second substrate can be produced quite economically in the form of a large card, and as a result a number of production steps can proceed parallel and simultaneously.

In a preferred embodiment, the power components are embodied as transistors, in particular as power MOSFETs or IGBTs, which have no plastic housing of their own. As a result, the electronic module can be quite compact, and all the electronic components are protected by means of a plastic body that is then integrally injection-molded on. Diodes can also be used economically as power components.

So that the heat generated in the power components can be effectively dissipated from the electronic module, the power components are located symmetrically relative to the second (logic) substrate. To that end, the logic substrate is preferably located in the middle of the first substrate, and the power components are symmetrically distributed around the second substrate.

The electronic module is especially advantageous for use as control electronics of an electric motor, since because of the compact connection of the electrical and mechanical interfaces in a single electronic module, this module can be located in the immediate vicinity of the collector and a position transducer of the electric motor. By means of the additional integration of carbon brushes with the electronic module, the noise produced can be reduced markedly because of the decoupling of vibration. Embodying the electronic module housing as an integrally injection-molded plastic body makes the electronic module a mechanically stable unit that can be installed in quite variable ways into the inside of the gearbox of the electronic motor in a self-supporting way.

It is especially favorable for the stamped grid to be located at a constant spacing from the second substrate inside the plastic body, in a single horizontal plane. On the one hand, as a single plane surface, the stamped grid is easier to produce; on the other hand, this makes it simpler to secure the second substrate and the power components to the first substrate (or stamped grid).

By means of the production method according to the invention, a compact electronic module that is especially well suited to use as control electronics in electric motors can be produced quite economically. If there are no components on the stamped grid in a region of the base body of the stamped grid that corresponds to the outline of the second substrate, then the second substrate can be adhesively bonded on in this region in an exactly calibrated way with an extremely slight spacing from the stamped grid. Since the electrical connections are implemented by means of bond wires, an insulating adhesive can favorably be used for connecting the two substrates to one another, and this adhesive can be hardened in a further process step. In the integral injection molding of the plastic body as a housing of the electronic module, both substrates are enclosed quite reliably by the plastic body, since no small voids between the two substrates have to be evacuated.

During the mounting of the electronic module, securing elements integrally formed onto the stamped grid for connecting the electronic module to the electric motor can simultaneously be used for the fixation in the joining device. As a result, the components—especially power semiconductors—can be secured exactly and reliably to the first substrate.

DRAWINGS

Figure 2:
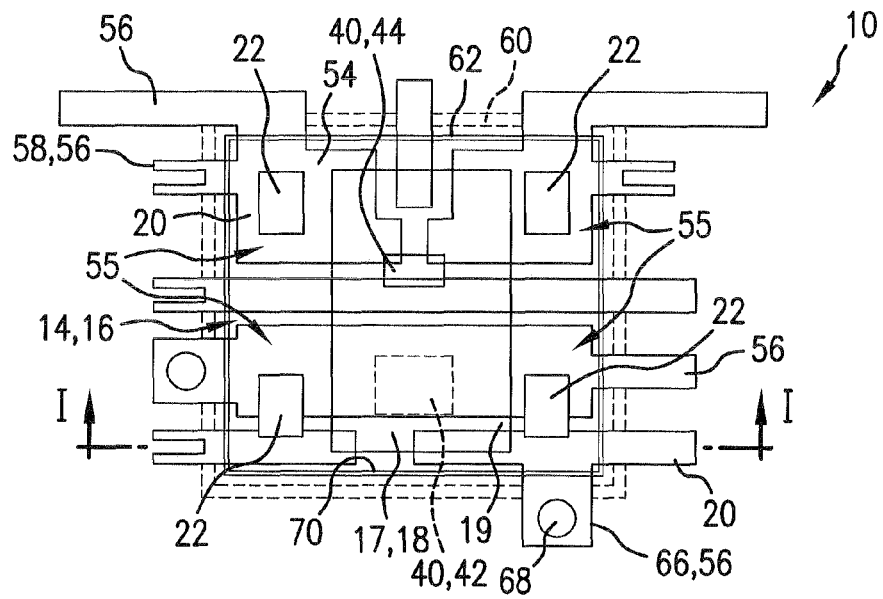

In the drawings, exemplary embodiments of a device according to the invention are shown and described in further detail in the ensuing description. Shown are:

FIG. 1, a schematic section through an electronic module;

FIG. 2, a top view of the corresponding module; and

Figure 3:
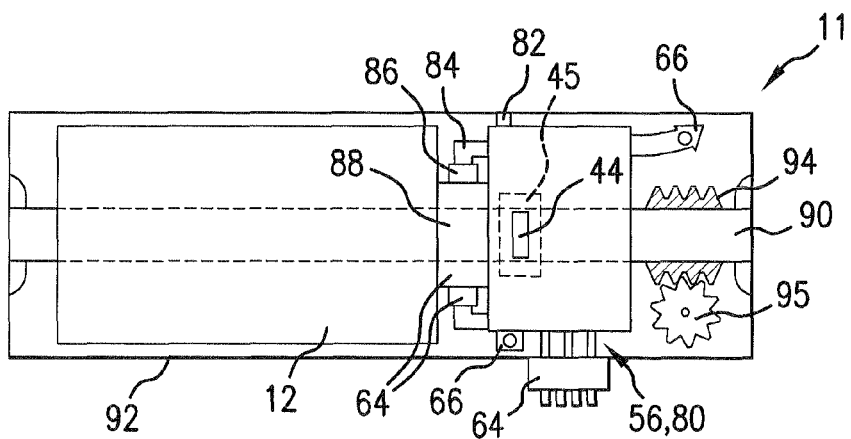

FIG. 3, an electronic motor, with a schematic arrangement of the electronic module.

DESCRIPTION OF THE EXEMPLARY EMBODIMENTS

In FIG. 1, the schematic layout of an electronic unit 10, embodied as an electronic module 10, is shown in section along the line I-I of FIG. 2. As a first, lower substrate 16, a stamped grid 14 is shaped, for instance from a sheet of copper, by means of stamping, bending and embossing with various segments 20. As power components 22, there are diodes 24 or transistors 26, such as power MOSFETs 28, on the stamped grid 14. The power components 22 have different structural heights 23. A ceramic substrate 30 with a metal coating 32, which is embodied in the form of conductor tracks 34, is provided as a second, upper substrate 18. Electronic components 40, such as a microprocessor 42, a position sensor 44, and SMD components 46, which together form the logic element 48 for triggering an electric motor 12, are located on this coating 32 of the second substrate 18 that faces away from the stamped grid 14. The electronic components 40 have been applied to the second substrate 18 by means of SMD methods or flip-chip technology before the mounting of the second substrate 18. The second substrate 18 is then connected directly to the first substrate 16 by means of an electrically insulating adhesive 36, and there are no components 4Q located between the two substrates 16, 18. The first substrate 16 has an upper surface 38, which, at least over the entire region 39 on which the second substrate 18 rests, extends in precisely one horizontal plane 37. The power components 22 are fixedly soldered to the stamped grid 14, and their lower bases 50, with the inclusion of the solder 52, rest directly on the stamped grid 14.

FIG. 2 schematically shows the relative location of the first substrate 16 to the second substrate 18. The first substrate 16 embodied as a stamped grid 14 has individual segments 20, which by means of a dam bar 60 (in dashed lines) are joined together in such a way that the stamped grid 14 can first be joined as a coherent part to the second substrate 18 and then can be extrusion-coated with a plastic body 62. The latter can be produced particularly by transfer molding using low-pressure epoxy compound. The first substrate 16 embodied as the stamped grid 14 comprises a base body 54, which after the completed production of the electronic module 10 is located completely inside the plastic body 62. Extensions 56, which form electrical and mechanical interfaces 58 with any of further components 64, further motor components 64 and/or external electrical components 64, are integrally formed onto the base body 54. The extensions 56 are embodied as securing elements 66 of the electronic module 10. They have bores 68, for instance, with which the first substrate 16, even during the manufacturing process of the electronic module 10, can be fixed in a joining form. The second substrate 18 has a base 19 that is smaller than the base body 54 of the first substrate 16. The second substrate 18 is secured to the lower base body 54 in a middle region 39 of this base body. Outside an outer circumference 70 of the second substrate 18, the power components 22 are fixedly soldered to the first substrate 16 in an outer peripheral region 55, as a result of which the power components 22 are located horizontally adjacent to the second substrate 18. The electronic module 10 has power components 22, for instance four of them, which are located point-symmetrically to the second substrate 18. The power components 22 are connected to one another and to the second substrate 18 by means of bond wires 74, and the electrical connections 72 are also located symmetrically to the second substrate 18. The bond wires 74 are contacted at the top sides 76 of the power components 22. The plastic body 62, shown schematically, then completely encloses the second substrate 18 and the base body 54 of the first substrate 16 having the power components 22 and the bond wires 74 completely. The plastic body 62 is dimensioned such that after being integrally injection-molded on, the dam bar 60 can be removed by means of stamping, so that the individual segments 20 are no longer conductively connected to one another. The various extensions 56 of the stamped grid 14 protrude from the plastic body 62. Some of the extensions 56 are embodied as plug pins 80 for the current connection and signal connection, while other extensions 56 are embodied as electrical contact points 82 for external electrical components 64. Two further extensions 56 are embodied as spring hoops 84, on which the carbon brushes 86 are located that cooperate with a collector 88 of an armature shaft 90. A further extension 56 is embodied as an electrical and mechanical connection member 82 that connects to an element that shields against electromagnetic interference.

In FIG. 3, a gear drive unit 11 is shown, in which an electric motor 12 with an armature shaft 90 is supported over its entire length in a housing 92. A first gear element 94 is supported on the armature shaft 90 and is coupled to a second gear element 95, and the drive torque is carried onward to a driven pinion, which for instance drives a window or sliding roof in a motor vehicle. For supplying current, the collector 88 is located on the armature shaft 90 and is wiper-connected to carbon brushes 85 that are connected to the electronic module 10 by means of spring hoops 84. The extensions 56 of the conductive stamped grid 14 protrude in the form of free ends out of the integrally molded-on plastic body 62 and form both the spring hoops 84 and electrical connections 82 for both electrical and mechanical contacting means to further components 64, not shown in detail. Besides the stamped grid 14 on the second substrate 18, the electronic module 10 has various electronic components 40, such as a microprocessor 42 or a position detection sensor 44, which cooperates with a position transducer 45 on the armature shaft 90. The electrically conductive stamped grid 14 with the integrated spring hoops 84 is mounted in the housing 92 radially to the armature shaft 90, after the gear components 94, 95 and the armature shaft 90 have been inserted radially into the housing 92. In order to attain a minimal spacing between the position sensor 44, cast integrally with the plastic body 62, and the position transducer 45—such as a magnet ring 45—located on the armature shaft 90, the plastic body 62 is located with only slight spacing directly radially opposite the position transducer 45. The electronic module 10 is press-fitted or firmly screwed (by means of bores 68) into the housing 92. Alternatively, the electronic module 10 can be cast integral or can be firmly clamped by means of a second housing part.

It will be noted that with regard to the exemplary embodiments shown in the drawings, manifold possible combinations of the various characteristics with one another are possible. The selection of the electronic components 40 can be adapted to the applicable use. Instead of the extensions 56 embodied as interfaces 58, the extensions may also be embodied in one piece with the corresponding motor components 64 or the external electrical components 64. The production of the conductive stamped grid 14 is not limited to stamping. Preferably, the device according to the invention is employed in electrical adjusting drives, particularly for windows and sliding roofs. The electronic module 10 of the invention may, however, also be used for EC motors, valve controls, or ignition coils.

The invention claimed is:

1. An electronic module, comprising an electrically conductive first substrate having a base body; a second electronically conductive substrate secured on said first substrate; at least one power component located on said first substrate, wherein said second substrate is assembled with further components on a side facing away from said first substrate, wherein said second substrate has a base which is smaller than said base body of said first substrate; and power components arranged outside an outer circumference of said second substrate besides said second substrate and secured to said first substrate, wherein said first substrate is a stamped grid with securing elements integrally formed on it and used for fixation and wherein said power components are bare die elements without a housing comprising power MOSFETs.

2. An electronic module as defined in claim 1, wherein said power components are connected with said first substrate in a manner selected from the group consisting of soldered on said first substrate and conductively adhesively bonded with said first substrate.

3. An electronic module as defined in claim 1, wherein said power components are electrically conductively connected to said first substrate by die attaching.

4. An electronic module as defined in claim 1, wherein said second substrate is electrically insulatingly adhesively bonded to said first substrate.

5. An electronic module as defined in claim 1, wherein said power components have electrical connections selected from the group consisting of electrical connections connecting said power components with one another, electrical connections connecting said power components with said second substrate, electrical connections connecting said power component with said first substrate, and combinations thereof, wherein said electrical connections of said power components are bond wires.

6. An electronic module as defined in claim 1, wherein said second substrate is a hybrid ceramic, on which electronic components are located, wherein said electronic components are components selected from the group consisting of a microprocessor, a triggering logic element, a position sensor element for an armature shaft of an electric motor, and combinations thereof, and wherein said electronic components are assembled variably by a technology selected from the group consisting of SMD technology and flip-chip technology with use of soldering technology.

7. An electronic module as defined in claim 1, wherein said power components in peripheral regions of said base body of said first substrate are located substantially symmetrically with respect to said second substrate.

8. An electronic module as defined in claim 1, wherein one of said power components and a shunt for current measurement are soldered or adhesively bonded to said first substrate.

9. An electronic module as defined in claim 1, wherein said base body of said first substrate and said second substrate together are extrusion-coated on a plastic body so that extensions integrally formed on said base body protrude from said plastic body and form an interface selected from the group consisting of an electrical interface, a mechanical interface, and both for attaching further motor components.

10. An electronic module as defined in claim 9, wherein said first substrate, toward said second substrate, has a plane surface extending continuously at least inside said plastic body in a single horizontal plane.

* * * * *